United States Patent
Daly et al.

(10) Patent No.: US 11,418,210 B2
(45) Date of Patent: Aug. 16, 2022

(54) DIGITAL-TO-ANALOG CONVERTER WITH REFERENCE VOLTAGE SELECTION SWITCH

(71) Applicant: Omni Design Technologies Inc., Milpitas, CA (US)

(72) Inventors: Denis Clarke Daly, Wellesley, MA (US); Vikas Singh, Newark, CA (US)

(73) Assignee: Omni Design Technologies, Inc., Milpitas, CA (US)

( * ) Notice: Subject to any disclaimer, the term of this patent is extended or adjusted under 35 U.S.C. 154(b) by 0 days.

(21) Appl. No.: 17/308,480

(22) Filed: May 5, 2021

(65) Prior Publication Data
US 2021/0351781 A1 Nov. 11, 2021

Related U.S. Application Data

(60) Provisional application No. 63/020,151, filed on May 5, 2020.

(51) Int. Cl.
*H03M 1/66* (2006.01)
*H03M 1/74* (2006.01)

(52) U.S. Cl.
CPC ..................................... *H03M 1/74* (2013.01)

(58) Field of Classification Search
CPC .......... H03M 1/74; H03M 1/123; H03M 1/08; H03M 1/804
USPC ....................................................... 341/150
See application file for complete search history.

(56) References Cited

U.S. PATENT DOCUMENTS

| 4,517,551 | A | * | 5/1985 | Campbell, Jr. | ......... H03M 1/74 341/122 |
| 4,845,382 | A | | 7/1989 | Eouzan et al. | |
| 5,619,203 | A | * | 4/1997 | Gross, Jr | .............. H03M 1/765 341/145 |
| 5,729,178 | A | | 3/1998 | Park et al. | |
| 5,757,857 | A | | 5/1998 | Buchwald | |
| 8,829,868 | B2 | * | 9/2014 | Waltman | ............. H02M 3/1584 323/272 |

(Continued)

OTHER PUBLICATIONS

W. C. Black et al., "Time-interleaved converter arrays", IEEE J. Solid-State Circuits, Dec. 1980, pp. 1022-1029, vol. 15, No. 12, IEEE.

(Continued)

*Primary Examiner* — Jean B Jeanglaude
(74) *Attorney, Agent, or Firm* — Intrinsic Law Corp.

(57) ABSTRACT

A digital-to-analog converter includes an array of capacitors, an array of capacitor switches, positive and negative high-bandwidth reference buffers, positive and negative low-bandwidth reference buffers, and a reference-voltage-selection switch. Each capacitor switch electrically couples a respective capacitor to either a positive or a negative reference voltage line. The reference-voltage-selection switch electrically couples the positive and negative reference voltage lines to either positive and negative high-bandwidth voltages or to positive and negative low-bandwidth voltages. The positive and negative high-bandwidth voltages are produced by the positive and negative high-bandwidth reference buffers. The positive and negative low-bandwidth voltages are produced by the positive and negative low-bandwidth reference buffers.

21 Claims, 13 Drawing Sheets

(56) References Cited

U.S. PATENT DOCUMENTS

| | | | | |
|---|---|---|---|---|
| 8,896,284 | B2* | 11/2014 | Fan | H02M 3/1563 |
| | | | | 323/285 |
| 9,407,145 | B1* | 8/2016 | Burstein | H03H 7/20 |
| 9,667,194 | B2* | 5/2017 | Lee | H03F 1/0205 |
| 9,787,291 | B1* | 10/2017 | Reindl | H03H 19/004 |
| 2006/0119412 | A1* | 6/2006 | Wei | H03F 3/005 |
| | | | | 327/337 |
| 2013/0002212 | A1* | 1/2013 | Fan | H02M 3/156 |
| | | | | 323/235 |
| 2013/0021009 | A1* | 1/2013 | Waltman | H02M 3/1584 |
| | | | | 323/271 |
| 2014/0048682 | A1 | 2/2014 | Kim et al. | |
| 2014/0070971 | A1 | 3/2014 | Zabroda | |
| 2015/0084800 | A1 | 3/2015 | Zhang et al. | |
| 2015/0280658 | A1* | 10/2015 | Lee | H03F 3/005 |
| | | | | 330/185 |
| 2016/0105195 | A1 | 4/2016 | Mulder | |
| 2016/0248380 | A1* | 8/2016 | Lee | H03F 3/45183 |
| 2017/0126211 | A1* | 5/2017 | Lau | H03K 3/017 |
| 2021/0281271 | A1 | 9/2021 | Bales et al. | |
| 2021/0281272 | A1 | 9/2021 | Singh et al. | |

OTHER PUBLICATIONS

B. Razavi, "Design Considerations for Interleaved ADCs", IEEE J. Solid-State Circuits, Aug. 2013, pp. 1806-1817, vol. 48, No. 8, IEEE.

N. Kurosawa et al., "Explicit analysis of channel mismatch effects in time-interleaved ADC systems", IEEE Transactions on Circuits and Systems I: Fundamental Theory and Applications, Mar. 2001, pp. 261-271, vol. 48, No. 3, IEEE.

R. Jewett et al., "A 12b 128MSamplels ADC with 0.05LSB DNL," IEEE International Solid-State Circuits Conference Digest of Technical Papers, Feb. 1997, pp. 138-139, IEEE.

K. Poulton et al., "A20GS/S 8b ADC with a 1MB Memory in 0.18,um CMOS", Dig. Tch. Papers, 2003, pp. 318-319, ISSCC.

J. Elbornsson et al., "Blind estimation of timing errors in interleaved AD converters", IEEE International Conference on Acoustics, Speech, and Signal Processing. Proceedings (Cat. No.01CH37221), 2001, pp. 3913-3916, vol. 6, Salt Lake City, UT, USA.

M. EL-Chammas et al., "A 12-GS/s 81-mW 5-bit Time-Interleaved Flash ADC With Background Timing Skew Calibration", J. Solid-State Circuits, Apr. 2011, pp. 838-847, vol. 46, No. 4, IEEE.

S. Devarajan et al.," A 12-b 10-GS/s Interleaved Pipeline ADC in 28-nm CMOS Technology", J. Solid-State Circuits, Dec. 2017, pp. 3204-3218, vol. 52, No. 12, IEEE.

S. Lee et al., "A 1GS/s 10b 18.9mW time-interleaved SAR ADC with background timing-skew calibration," International Solid-State Circuits Conference Digest of Technical Papers, Feb. 2014, pp. 384-385, IEEE.

M. Tamba et al., "A method to improve SFDR with random interleaved sampling method", Proceedings International Test Conference 2001 (Cat. No.01CH37260), 2001, pp. 512-520, Baltimore, MD, USA.

J. Elbornsson et al., "Analysis of mismatch noise in randomly interleaved ADC system", International Conference on Acoustics, Speech, and Signal Processing, 2003. Proceedings. (ICASSP '03)., 2003, pp. VI-280, IEEE.

ISR, "International Search Report", PCT/US21/71337, dated Feb. 16, 2022.

* cited by examiner

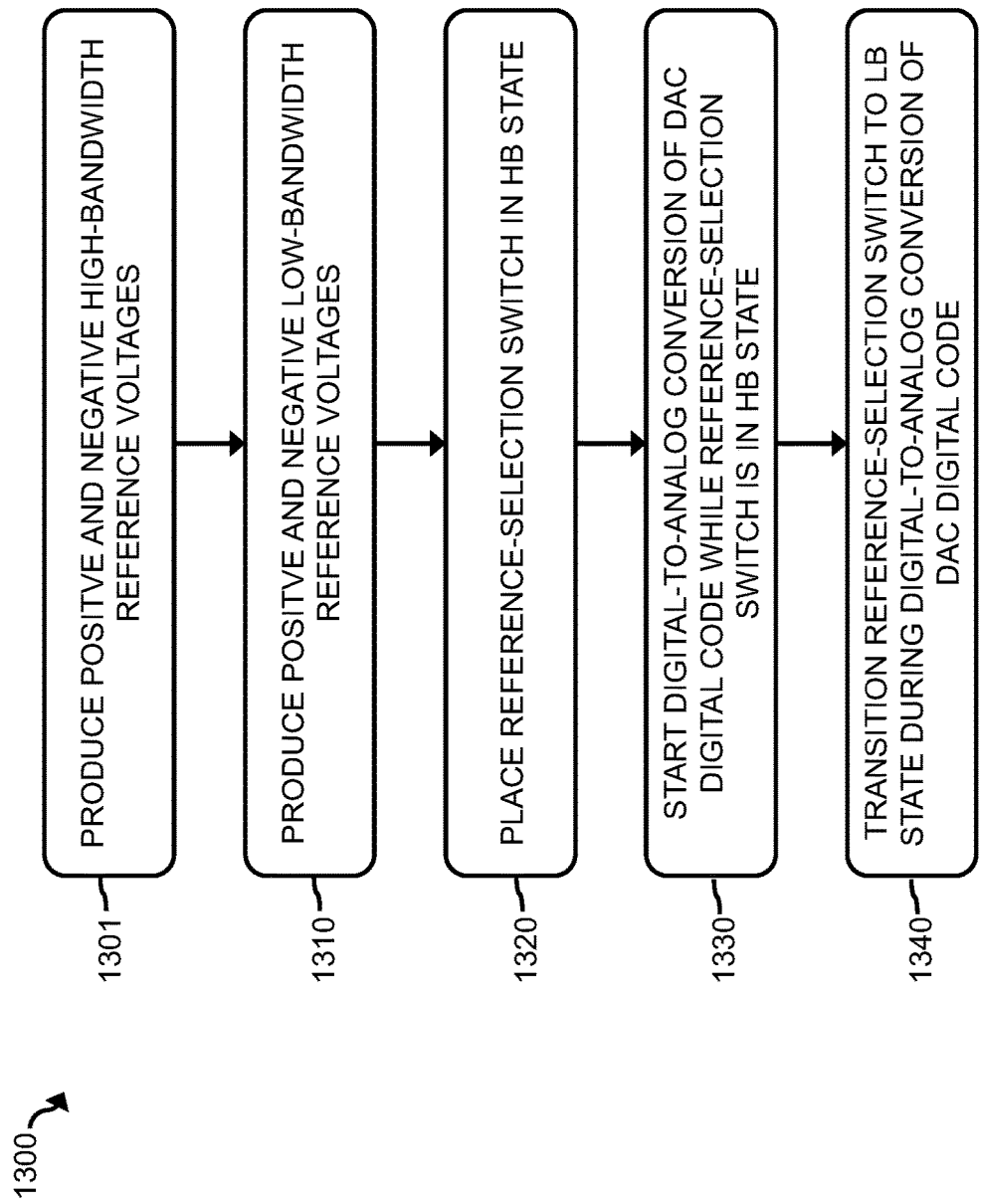

DIGITAL-TO-ANALOG CONVERTER WITH REFERENCE VOLTAGE SELECTION SWITCH

CROSS-REFERENCE TO RELATED APPLICATIONS

This application claims priority to U.S. Provisional Application No. 63/020,151, titled "References for Data Converters," filed on May 5, 2020, which is hereby incorporated by reference.

TECHNICAL FIELD

This application relates generally to digital-to-analog converters.

BACKGROUND

A key building block of data converters is a digital-to-analog converter (DAC). A DAC converts a digital value to an analog value based on the digital code (sometimes abbreviated as DIN) and the reference voltages (VREFP/VREFN). In integrated circuits, there are several ways to implement DACs including capacitor-based DACs (CAP-DACs) and resistor-based DACs (sometimes abbreviated as R-DACs).

FIG. 1 is a schematic diagram of a switched-capacitor DAC 10 according to the prior art. The switched-capacitor DAC 10 includes an array of capacitors 100, DAC digital code 110, capacitor switches 120, and a preset switch 130. Each capacitor switch 120 connects a respective capacitor 100 to either a positive reference voltage VREFP or to a negative reference voltage VREFN. The DAC reference voltage is the difference between VREFP and VREFN. The reference voltages VREFP and VREFN can be generated by reference buffers.

FIG. 2 is an example timing diagram 20 for the switched-capacitor DAC 10 illustrated in FIG. 1. Discrete-time DACs, such as switched-capacitor DAC 10, are typically clocked at a fixed frequency $F_s$ with a period T where $$T = \frac{1}{F_s}.$$

The reference buffers can be classified into two categories: high-bandwidth and low-bandwidth. A high-bandwidth reference buffer has an output time constant that is smaller than the settling time allocated to the DAC (e.g., period T) thereby allowing the buffer output to mostly or fully settle during the DAC settling time. A low-bandwidth reference buffer has an output time constant that is larger than the settling time allocated to the DAC (e.g., period T). Thus, a low-bandwidth reference buffer does not fully settle during the DAC settling time. Instead, a large reservoir capacitor, $C_{RESERVOIR}$, is placed at the buffer output to provide the charge required for DAC settling, and the reference buffer slowly recharges the reservoir capacitor over multiple DAC periods T.

FIG. 3 is a schematic diagram of positive and negative high-bandwidth reference buffers 30, 32, respectively. Each high-bandwidth reference buffer 30, 32 has a nominal reference voltage input VREFP$_{nom}$ and VREFN$_{nom}$, respectively. The output of each high-bandwidth reference buffer 30, 32 is electrically coupled to a buffer output resistor R$_{OUT}$ to produce the positive and negative reference voltages VREFP and VREFN, respectively.

The output RC time constant of the high-bandwidth reference buffers 30, 32 is smaller than the allocated DAC settling time (e.g., T) to ensure that the DAC fully settles within the available settling time. The capacitance for the output RC time constant is typically dominated by the DAC load and the resistance is a combination of the buffer output resistance (R$_{OUT}$) and the resistance of the capacitor switches 120. As the DAC capacitive load is typically fixed, the reference buffer output resistance R$_{OUT}$ and/or the capacitor switch 120 resistance are lowered to reduce the output RC time constant of the high-bandwidth reference buffers 30, 32.

FIG. 4 is a schematic diagram of positive and negative low-bandwidth reference buffers 40, 42, respectively. Each low-bandwidth reference buffer 40, 42 has a nominal reference voltage input VREFP$_{nom}$ and VREFN$_{nom}$, respectively. The output of each high-bandwidth reference buffer 40, 42 is electrically coupled to a buffer output resistor R$_{OUT}$. A reservoir capacitor C$_{RESERVOIR}$ is electrically coupled in parallel to the outputs of the positive and negative low-bandwidth reference buffers 40, 42.

The output RC time constant of the low-bandwidth reference buffers 40, 42 is larger than the allocated DAC settling time (e.g., T). Due to this incomplete settling, typically one or both of the two approaches below is/are taken.

First, a large reservoir capacitance (C$_{RESERVOIR}$) is placed on VREFP and VREFN to provide the charge required for DAC settling. A sufficiently-large capacitance ensures that VREFP and VREFN voltages remain sufficiently close to VREFP$_{nom}$ and VREFN$_{nom}$. For example, if C$_{RESERVOIR}$ is significantly larger than the total DAC capacitance, then VREFP$_{LBW}$ and VREFN$_{LBW}$ do not significantly change during a single period and the AC current consumed by the CAP-DAC is supplied by the C$_{RESERVOIR}$ capacitor rather than by the reference buffers. This has the benefit that the settling in a single period is not impacted by the reference buffers' output resistance R$_{OUT}$. The reference buffers only supply the low-frequency and DC current. At high DAC resolutions (e.g., 10 bits and higher), the capacitor C$_{RESERVOIR}$ can become quite large compared to other circuits, resulting in additional circuit area and cost.

Second, the DAC can be designed to draw consistent current regardless of DAC digital code, ensuring that the VREFP$_{LBW}$ and VREFN$_{LBW}$ do not vary with DAC digital code regardless of the size of C$_{RESERVOIR}$. While such an approach can be effective to reduce the required size of C$_{RESERVOIR}$, it usually has some undesirable tradeoffs including increased noise, increased complexity, and/or reduced speed.

Assuming a sufficiently-large C$_{RESERVOIR}$, the high-bandwidth reference buffer typically requires higher power consumption than the low-bandwidth reference buffer as the DAC settling time is degraded by the buffer output resistance R$_{OUT}$. Minimizing R$_{OUT}$ requires spending additional power that is not needed in a DAC driven by a low-bandwidth reference buffer.

It would be desirable to overcome these and/or other deficiencies in the art.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a digital-to-analog converter (DAC) comprising: an array of capacitors; an array of capacitor switches, each capacitor switch electrically coupled to a first terminal of a respective capacitor and having a first state in which the first terminal is electrically coupled to a positive reference voltage line and a second state in which the first terminal is electrically coupled to a negative reference voltage line; a positive high-bandwidth reference buffer having an input electrically coupled to a positive reference voltage and an output electrically coupled to a positive HB output resistor to produce a positive high-bandwidth reference voltage, the positive high-bandwidth reference buffer having a first HB output time constant that is greater than or equal to a sampling period (T) of the DAC; a negative high-bandwidth reference buffer having an input electrically coupled to a negative reference voltage and an output electrically coupled to a negative HB output resistor to produce a negative high-bandwidth reference voltage, the negative high-bandwidth reference buffer having a second HB output time constant that is greater than or equal to T; a positive low-bandwidth reference buffer having an input electrically coupled to the positive reference voltage and an output electrically coupled to a positive LB output resistor to produce a positive low-bandwidth reference voltage, the positive low-bandwidth reference buffer having a first LB output time constant that is less than T; a negative low-bandwidth reference buffer having an input electrically coupled to the negative reference voltage and an output electrically coupled to a negative LB output resistor to produce a negative low-bandwidth reference voltage, the negative low-bandwidth reference buffer having a second LB output time constant that is less than T; a reference-selection switch electrically coupled to the positive and negative reference voltage lines, the reference selecting switch having an HB state in which the positive and negative reference voltage lines are electrically coupled to the positive and negative high-bandwidth voltages, respectively, and an LB state in which the positive and negative reference voltage lines are electrically coupled to the positive and negative low-bandwidth voltages, respectively, wherein $$T = \frac{1}{F_s}$$

and $F_s$ is a sampling rate of the DAC.

In one or more embodiments, the DAC further comprises a positive LB output voltage line electrically coupled to the positive LB output resistor, the positive LB output voltage line having the positive low-bandwidth reference voltage; a negative LB output voltage line electrically coupled to the negative LB output resistor, the negative LB output voltage line having the negative low-bandwidth reference voltage; and a reservoir capacitor having a first terminal electrically coupled to the positive LB output voltage line and a second terminal electrically coupled to the negative LB output voltage line. In one or more embodiments, the DAC further comprises a memory that stores DAC digital code, wherein: the memory is electrically coupled to the capacitor switches and to the reference-selection switch, the DAC digital code determines a state of each capacitor switch, and the DAC digital code determines a state of the reference-selection switch. In one or more embodiments, the DAC is configured to perform a digital-to-analog conversion of the DAC digital code during the sampling period, and the reference-selection switch is in the HB state when the DAC starts the digital-to-analog conversion of the DAC digital code.

In one or more embodiments, the reference-selection switch transitions from the HB state to the LB state after a predetermined time period from the start of the digital-to-analog conversion of the DAC digital code. In one or more embodiments, the reference-selection switch transitions from the HB state to the LB state during the digital-to-analog conversion of the DAC digital code. In one or more embodiments, the reference-selection switch is only in the LB state during the digital-to-analog conversion of a least-significant bit in the DAC digital code.

In one or more embodiments, the DAC digital code is a first DAC digital code, the reference-selection switch stays in the HB state for the digital-to-analog conversion of the first DAC digital code, the reference-selection switch transitions from the HB state to the LB state during the digital-to-analog conversion of a second DAC digital code, the second DAC digital code stored in the memory, and the digital-to-analog conversion of the second DAC digital code occurs after the digital-to-analog conversion of the first DAC digital code. In one or more embodiments, the memory stores a plurality of DAC digital codes, the DAC is configured to perform a digital-to-analog conversion of the plurality of DAC digital codes over a plurality of sampling periods, and the reference-selection switch is in the HB state at a beginning of each sampling period.

In one or more embodiments, a root mean square of the positive high-bandwidth reference voltage is about equal to a root mean square of the positive low-bandwidth reference voltage, and a root mean square of the negative high-bandwidth reference voltage is about equal to a root mean square of the negative low-bandwidth reference voltage.

Another aspect of the invention is directed to a digital-to-analog converter (DAC) comprising: an array of capacitors including first and second groups of the capacitors; an array of capacitor switches, each capacitor switch electrically coupled to a first terminal of a respective capacitor and having a first state in which the first terminal is electrically coupled to a positive reference voltage line and a second state in which the first terminal is electrically coupled to a negative reference voltage line; a positive high-bandwidth reference buffer having an input electrically coupled to a first positive reference voltage and an output electrically coupled to a positive HB output resistor to produce a positive high-bandwidth reference voltage, the positive high-bandwidth reference buffer having a first HB output time constant that is greater than or equal to a sampling period (T) of the digital-to-analog converter; a negative high-bandwidth reference buffer having an input electrically coupled to a first negative reference voltage and an output electrically coupled to a negative HB output resistor to produce a negative high-bandwidth reference voltage, the negative high-bandwidth reference buffer having a second HB output time constant that is greater than or equal to T; a positive low-bandwidth reference buffer having an input electrically coupled to the first positive reference voltage and an output electrically coupled to a positive LB output resistor to produce a positive low-bandwidth reference voltage, the positive low-bandwidth reference buffer having a first LB output time constant that is less than T; a negative low-bandwidth reference buffer having an input electrically coupled to the first negative reference voltage and an output electrically coupled to a negative LB output resistor to produce a negative low-bandwidth reference voltage, the negative low-bandwidth reference buffer having a second LB output time constant that is less than T; a reference-selection switch electrically coupled to the positive and negative reference voltage lines of the first group of capacitors, the reference-selection switch having an HB state in which the positive and negative reference voltage lines are electrically coupled to the positive and negative high-bandwidth voltages, respectively, and an LB state in which the positive and negative reference voltage lines are electrically coupled to the positive and negative low-bandwidth voltages, respectively, wherein:

$$T = \frac{1}{F_s},$$

$F_s$ is a sampling rate of the DAC, and the positive and negative reference voltage lines of the second group of capacitors are electrically coupled to positive and negative third reference voltages, respectively.

In one or more embodiments, the positive and negative reference voltage lines of the second group of capacitors are electrically coupled to the positive and negative high-bandwidth reference voltages, respectively, whereby the positive and negative third reference voltages are the same as the positive and negative low-bandwidth reference voltages, respectively. In one or more embodiments, the positive and negative reference voltage lines of the second group of capacitors are electrically coupled to the positive and negative high-bandwidth reference voltages, respectively, whereby the positive and negative third reference voltages are the same as the positive and negative high-bandwidth reference voltages, respectively.

In one or more embodiments, the DAC further comprises a positive third reference buffer having an input electrically coupled to a second positive reference voltage and an output electrically coupled to a positive third output resistor to produce the positive third reference voltage; and a negative third reference buffer having an input electrically coupled to a second negative reference voltage and an output electrically coupled to a negative third output resistor to produce the negative third reference voltage.

Yet another aspect of the invention is directed to a system comprising a first digital-to-analog converter (DAC) comprising: an array of first capacitors; and an array of first capacitor switches, each first capacitor switch electrically coupled to a first terminal of a respective first capacitor and having a first state in which the first terminal is electrically coupled to a first positive reference voltage line and a second state in which the first terminal is electrically coupled to a first negative reference voltage line. The system further comprises a second DAC comprising: an array of second capacitors; and an array of second capacitor switches, each second capacitor switch electrically coupled to a first terminal of a respective second capacitor and having a first state in which the first terminal of the respective second capacitor is electrically coupled to a second positive reference voltage line and a second state in which the first terminal of the respective second capacitor is electrically coupled to a second negative reference voltage line. The system further includes a positive high-bandwidth reference buffer having an input electrically coupled to a positive reference voltage and an output electrically coupled to a positive HB output resistor to produce a positive high-bandwidth reference voltage, the positive high-bandwidth reference buffer having a first HB output time constant that is greater than or equal to a sampling period (T) of the digital-to-analog converter; a negative high-bandwidth reference buffer having an input electrically coupled to a negative reference voltage and an output electrically coupled to a negative HB output resistor to produce a negative high-bandwidth reference voltage, the negative high-bandwidth reference buffer having a second HB output time constant that is greater than or equal to T; a positive low-bandwidth reference buffer having an input electrically coupled to the positive reference voltage and an output electrically coupled to a positive LB output resistor to produce a positive low-bandwidth reference voltage, the positive low-bandwidth reference buffer having a first LB output time constant that is less than T; a negative low-bandwidth reference buffer having an input electrically coupled to the negative reference voltage and an output electrically coupled to a negative LB output resistor to produce a negative low-bandwidth reference voltage, the negative low-bandwidth reference buffer having a second LB output time constant that is less than T; a first DAC reference-selection switch electrically coupled to the first positive and first negative reference voltage lines, the first DAC reference-selection switch having a first HB state in which the first positive and first negative reference voltage lines are electrically coupled to the positive and negative high-bandwidth voltages, respectively, and a first LB state in which the first positive and first negative reference voltage lines are electrically coupled to the positive and negative low-bandwidth voltages, respectively; and a second DAC reference-selection switch electrically coupled to the second positive and second negative reference voltage lines, the second DAC reference-selection switch having a second HB state in which the second positive and second negative reference voltage lines are electrically coupled to the positive and negative high-bandwidth voltages, respectively, and a second LB state in which the second positive and second negative reference voltage lines are electrically coupled to the positive and negative low-bandwidth voltages, respectively; wherein:

$$T = \frac{1}{F_s}$$

and $F_s$ is a sampling rate of the DAC.

In one or more embodiments, the first and second DAC reference-selection switches are configured to switch out of phase such that: when the first DAC reference-selection switch is in the first HB state, the second DAC reference-selection switch is in the second LB state, and when the first DAC reference-selection switch is in the first LB state, the second DAC reference-selection switch is in the second HB state. In one or more embodiments, when the second DAC reference-selection switch is in the second HB state, the first DAC reference-selection switch is in the first LB state, and when the second DAC reference-selection switch is in the second LB state, the first DAC reference-selection switch is in the first HB state. In one or more embodiments, the first and second DACs comprise a time-interleaved DAC.

Another aspect of the invention is directed to a method of operating a digital-to-analog converter (DAC), comprising: producing positive and negative high-bandwidth reference voltages with positive and negative high-bandwidth reference buffers, respectively, each of the positive and negative high-bandwidth reference buffers having an output electrically coupled to a respective HB output resistor and having a respective HB output time constant that is greater than or equal to a sampling period (T) of the DAC; producing positive and negative low-bandwidth reference voltages with positive and negative low-bandwidth reference buffers, respectively, each of the positive and negative low-bandwidth reference buffers having an output electrically coupled to a respective LB output resistor and having a respective LB output time constant that is less than T; placing a reference-selection switch in an HB state to electrically couple a positive reference voltage line and a negative reference voltage line to the positive and negative high-bandwidth voltages, respectively, wherein the positive and negative reference voltage lines are electrically coupled to an array of capacitors; with the array of capacitors, starting a digital-to-analog conversion of a DAC digital code while the reference-selection switch is in the HB state; and transitioning the reference-selection switch to an LB state during the digital-to-analog conversion of the DAC digital code, wherein in the LB state the positive and negative reference voltage lines are electrically coupled to the positive and low-bandwidth voltages, respectively, wherein:

$$T = \frac{1}{F_s}$$

and $F_s$ is a sampling rate of the DAC.

In one or more embodiments, the method further comprises transitioning the reference-selection switch to the LB state after a predetermined time period from a start of the digital-to-analog conversion of the DAC digital code. In one or more embodiments, the method further comprises starting the digital-to-analog conversion of a most-significant bit (MSB) of the DAC digital code when the reference-selection switch is in the HB state; transitioning the reference-selection switch to the LB state during the digital-to-analog conversion of the MSB; and performing the digital-to-analog conversion of a least-significant bit of the DAC digital code only when the reference-selection switch is in the HB state.

BRIEF DESCRIPTION OF THE DRAWINGS

For a fuller understanding of the nature and advantages of the present concepts, reference is made to the detailed description of preferred embodiments and the accompanying drawings.

FIG. 13 is a flow chart of a method for operating a DAC according to an embodiment.

DETAILED DESCRIPTION

A digital-to-analog converter (DAC) includes an array of capacitors, an array of capacitor switches, positive and negative high-bandwidth reference buffers, positive and negative low-bandwidth reference buffers, and a reference-selection switch. Each capacitor switch electrically couples a respective capacitor to either a positive or a negative reference voltage line. The reference-selection switch electrically couples the positive and negative reference voltage lines to either positive and negative high-bandwidth voltages or to positive and negative low-bandwidth voltages. The positive and negative high-bandwidth voltages are produced by the positive and negative high-bandwidth reference buffers where an output time constant of the positive and negative high-bandwidth reference buffers is greater than or equal to a sampling period (T) of the DAC. The positive and negative low-bandwidth voltages are produced by the positive and negative low-bandwidth reference buffers where an output time constant of the positive and negative low-bandwidth reference buffers is less than T. The sampling period T is equal to $$\frac{1}{F_s}$$

where Fs is the sampling frequency of the DAC.

The reference-selection switch has an HB state in which the positive and negative reference voltage lines are electrically coupled to the positive and negative high-bandwidth voltages. In addition, the reference-selection switch has an LB state in which the positive and negative reference voltage lines are electrically coupled to the positive and negative low-bandwidth voltages. The reference-selection switch can be in the HB state at the start of the digital-toanalog conversion of DAC digital data. During the digital-to-analog conversion of the DAC digital data, the reference-selection switch can transition to the LB state. The transition from the HB state to the LB state can occur after a predetermined time period from the start of the digital-to-analog conversion of the DAC digital data. For example, the reference-selection switch can transition from the HB state to the LB state during the digital-to-analog conversion of the most-significant bit (MSB) of the DAC digital data. Additionally or alternatively, the reference-selection switch can transition from the HB state to the LB state after converting a first portion or half of the DAC digital data. In another example, the reference-selection switch can be and remain in the LB state for the digital-to-analog conversion of the least-significant bit (LSB) of the DAC digital data.

Figure 5:
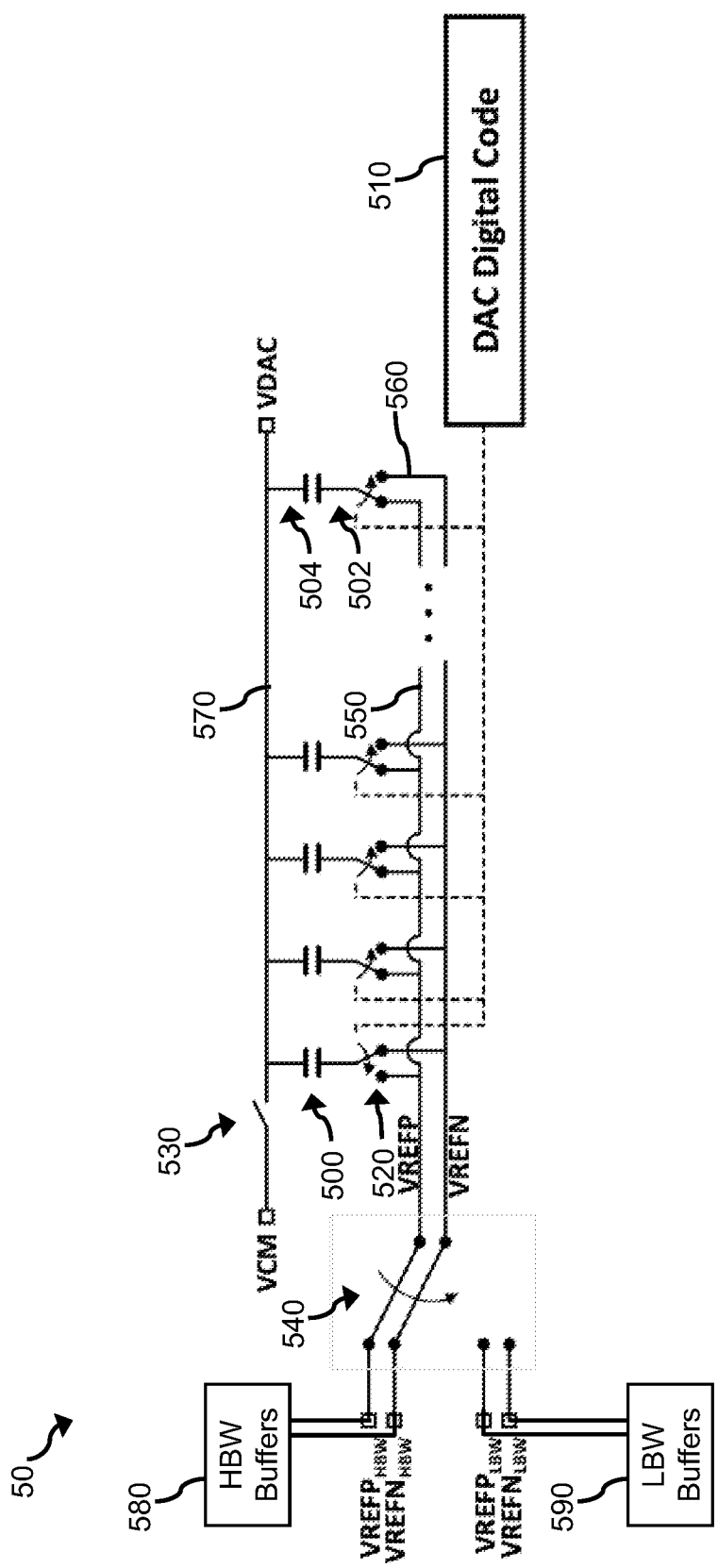
FIG. 5 is a schematic diagram of a DAC according to an embodiment.

FIG. 5 is a schematic diagram of a DAC 50 according to an embodiment. The DAC 50 includes an array of capacitors 500, DAC digital code 510, capacitor switches 520, a preset switch 530, and a reference-voltage-selection switch 540. DAC 50 can be a switched-capacitor DAC, a successive-approximation (SAR) DAC, a time-interleaved DAC, or another DAC.

The capacitors 500 can be identical to one another, different from one another, or can include groups of different capacitors. A first terminal 502 of each capacitor 500 is electrically coupled to a respective capacitor switch 520. Each capacitor switch 520 has a first state in which the first terminal 502 is electrically coupled to a positive reference voltage line 550 and a second state in which the first terminal 502 is electrically coupled to a negative reference voltage line 560. The state of the capacitor switches 520 can be set using or based on the DAC digital code 510, which can be stored in memory (e.g., non-transitory memory).

A second terminal 504 of each capacitor 500 is electrically coupled to a DAC output line 570 that has an output terminal having an output VDAC voltage. The DAC output line 570 is also electrically coupled to a preset switch 530. The preset switch 530 has a closed state in which the DAC output line 570 is electrically coupled to a common-mode voltage VCM which sets the output VDAC voltage to be equal to the common-mode voltage VCM. In addition, the preset switch 530 has an opened state in which the DAC output line 570 is de-coupled from the common-mode voltage VCM. Timing controls can be used to set state of preset switch 530.

The reference-voltage-selection switch 540 has an HB state (e.g., a first state) and an LB state (e.g., a second state). When the reference-voltage-selection switch 540 is in the HB state, the positive and negative reference voltage lines 550, 560 are electrically coupled to positive and negative high-bandwidth voltages $VREFP_{HBW}$ and $VREFN_{HBW}$, respectively. When the reference-voltage-selection switch 540 is in the LB state, the positive and negative reference voltage lines 550, 560 are electrically coupled to positive and negative low-bandwidth voltages $VREFP_{LBW}$ and $VREFN_{HBW}$, respectively. The state of the reference-voltage-selection switch 540 can be set using or based on the DAC digital code 510. For example, a processor or processor-based controller can detect the DAC digital code 510 and set the reference-voltage-selection switch 540 based on the DAC digital code 510.

The positive and negative high-bandwidth voltages $VREFP_{HBW}$ and $VREFN_{HBW}$ can be produced by high-bandwidth reference buffers 580, which can be the same as or can include positive and negative high-bandwidth reference buffers 30, 32 including respective buffer output resistors $R_{OUT}$. The positive and negative low-bandwidth voltages $VREFP_{LBW}$ and $VREFN_{HBW}$ can be produced by low-bandwidth reference buffers 590, which can be the same as or can include positive and negative high-bandwidth reference buffers 40, 42 including respective buffer output resistors $R_{OUT}$ and reservoir capacitor $C_{RESERVOIR}$.

Figure 1:
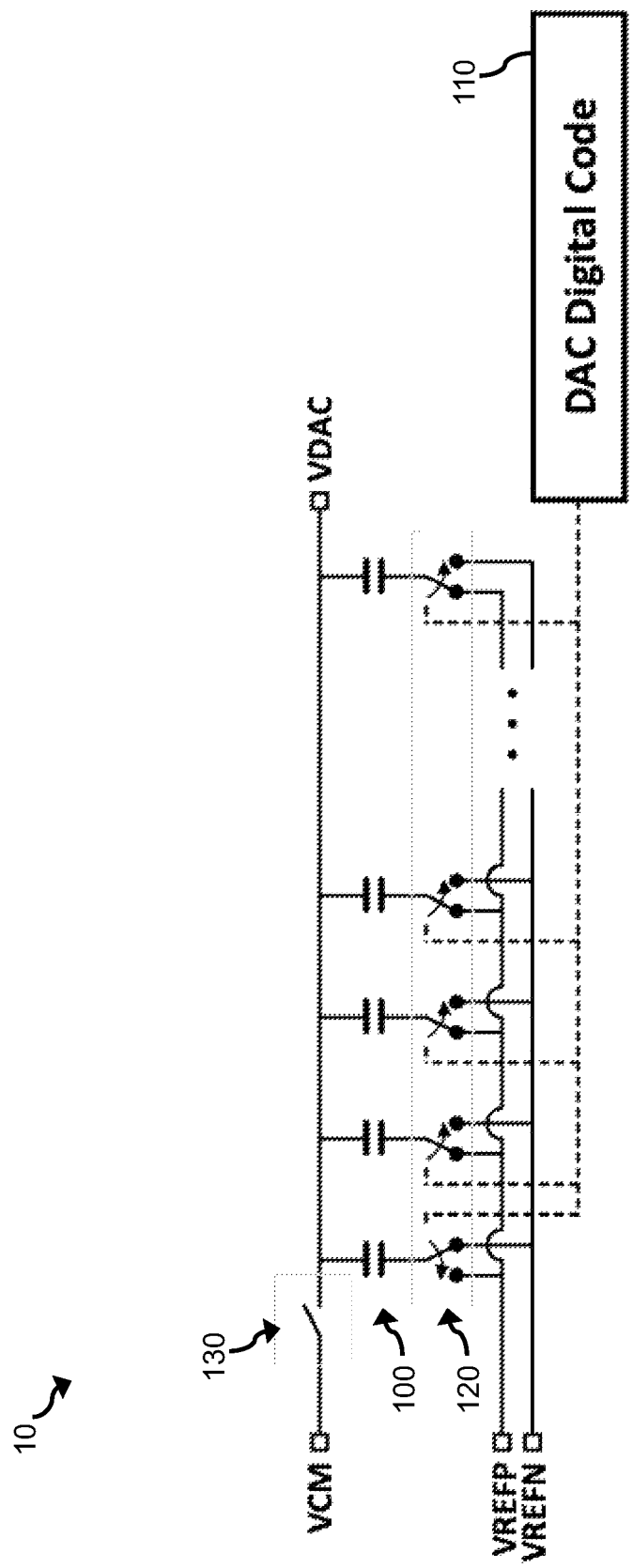
FIG. 1 is a schematic diagram of a switched-capacitor DAC according to the prior art.
Figure 2:
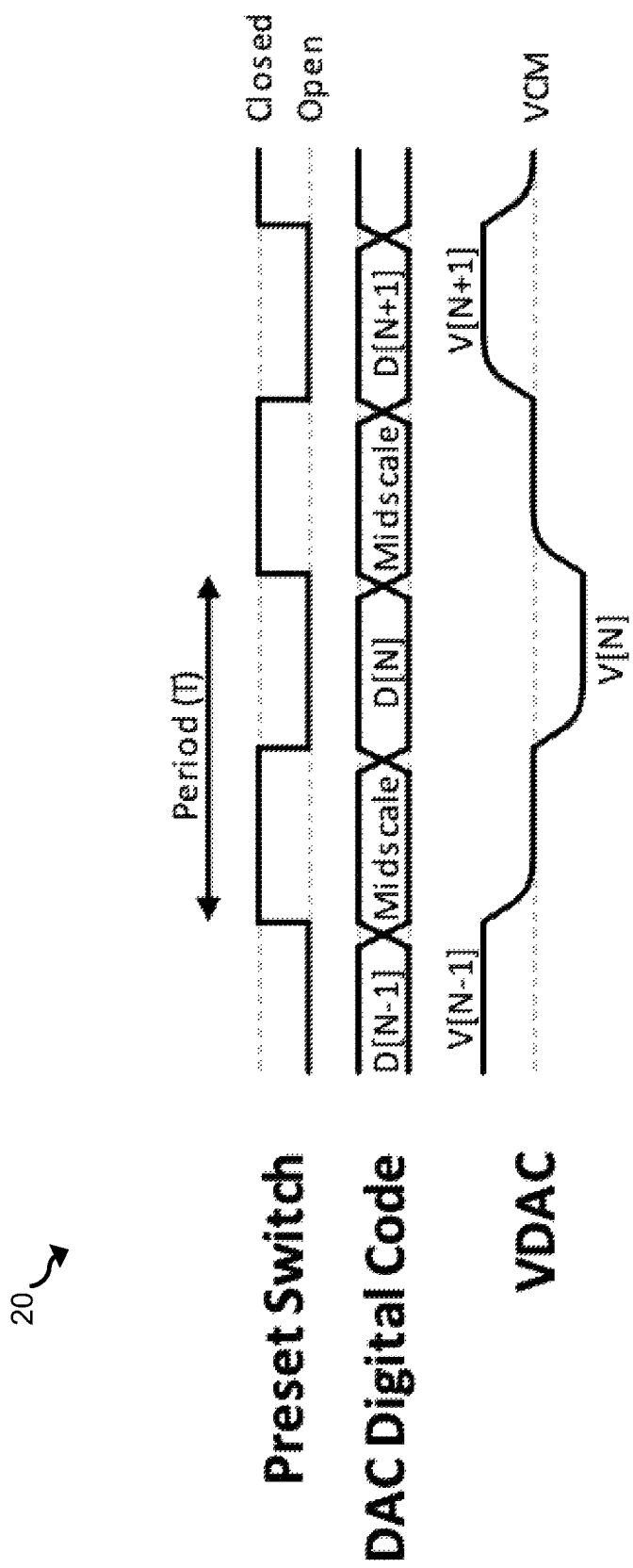
FIG. 2 is an example timing diagram for the switched-capacitor DAC illustrated in FIG. 1
Figure 3:
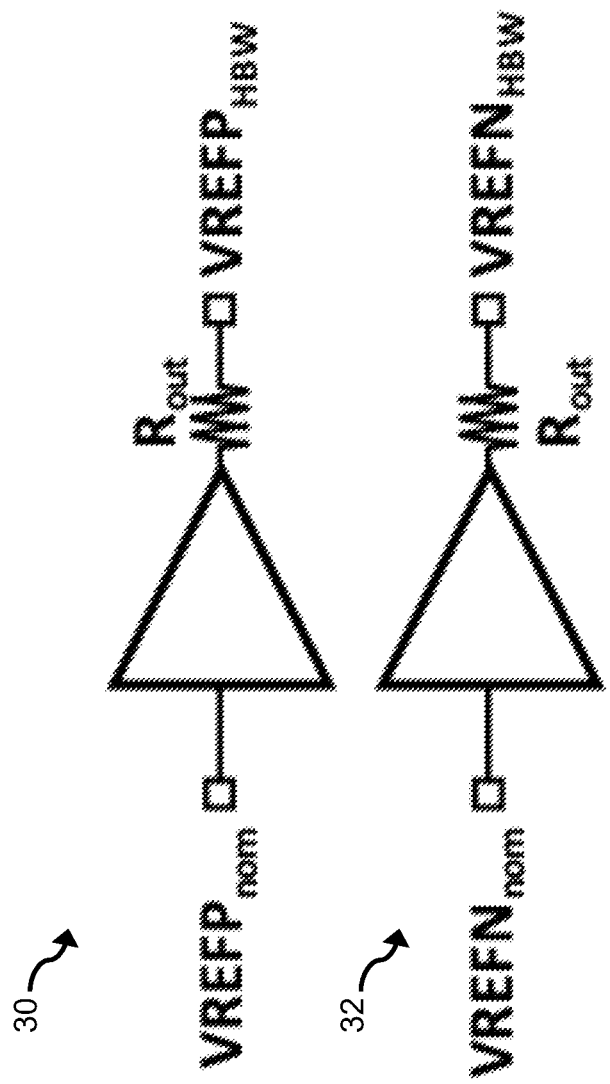
FIG. 3 is a schematic diagram of positive and negative high-bandwidth reference buffers, respectively, according to the prior art.
Figure 4:
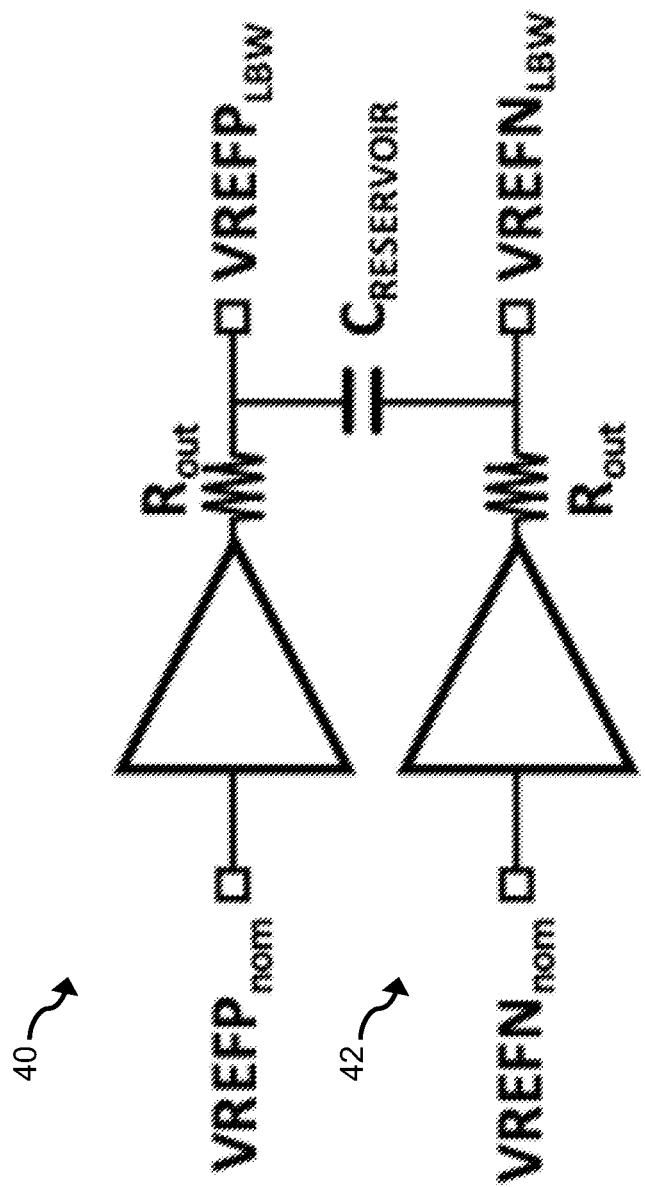
FIG. 4 is a schematic diagram of positive and negative low-bandwidth reference buffers, respectively, according to the prior art.
Figure 6:
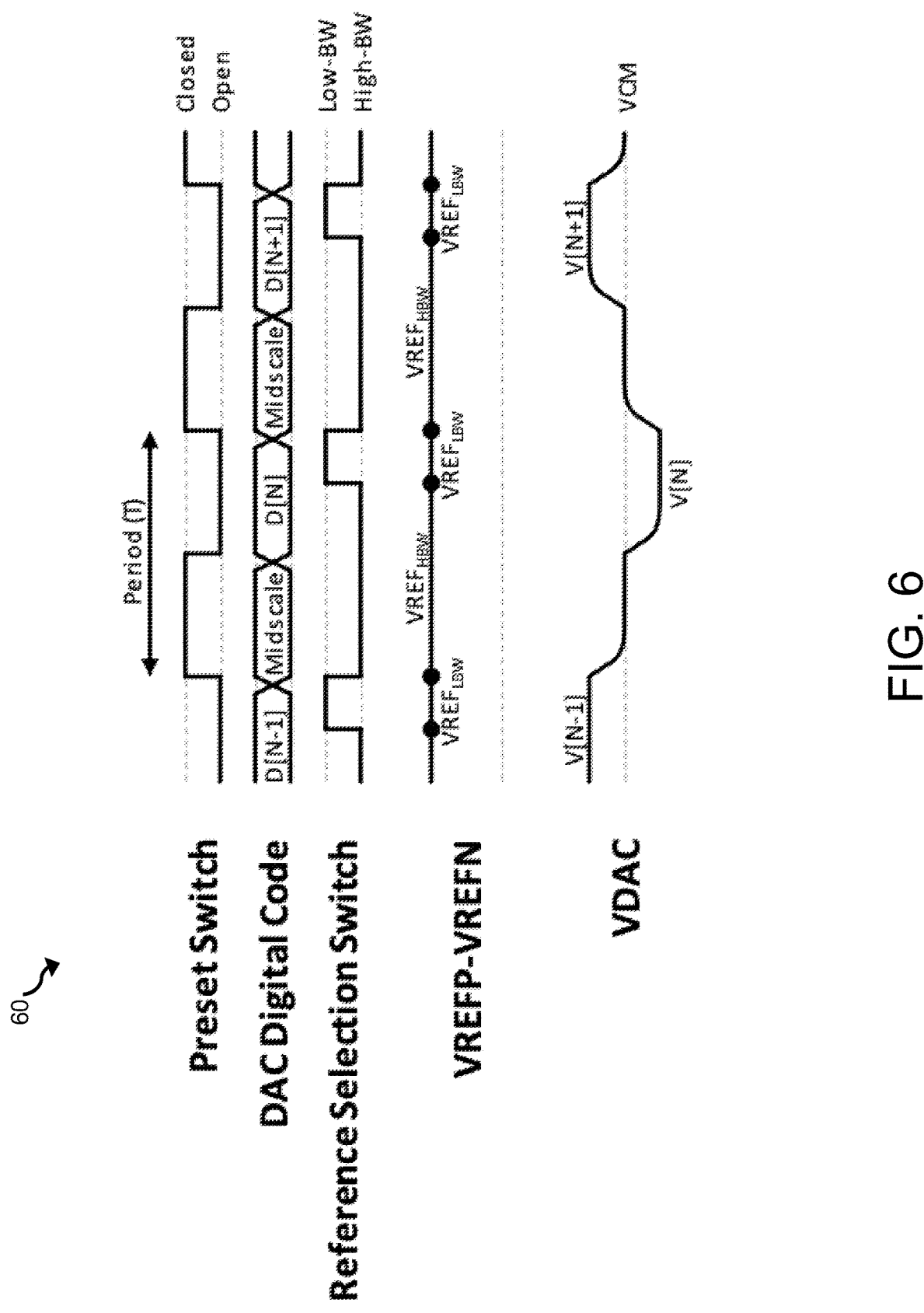
FIG. 6 is an example timing diagram for the DAC illustrated in FIG. 5 according to an embodiment.

FIG. 6 is an example timing diagram 60 for DAC 50 according to an embodiment. The timing diagram 60 illustrates that when the preset switch 530 is in the closed state and initially when the preset switch 530 transitions to the opened state, the reference-voltage-selection switch 540 is in the HB state. Later, when the preset switch 530 is open and the VDAC has settled to the appropriate voltage, the reference-voltage-selection switch 540 transitions to the LB state. If we assume that VDAC fully settles when the high-bandwidth reference buffer is enabled, and we assume that $VREF_{HBW}=VREF_{LBW}$, then the voltage VDAC does not change when switching from the high-bandwidth reference buffer to the low bandwidth reference buffer. Hence VDAC is the same in FIGS. 6 and 2.

In some DAC implementations, the DAC digital code changes sequentially, asymptotically approaching a desired final value. For example, in a SAR DAC, the DAC digital code is updated sequentially in a feedback loop to force VDAC towards a desired voltage. Operating this feedback loop as quickly as possible requires a DAC with a fast settling time. A low-bandwidth reference buffer with a large capacitive reservoir would achieve the fastest settling by removing the speed degradation of the reference buffer output resistance, but the required $C_{RESERVOIR}$ size is often prohibitive, particularly for high-resolution DACs. When the DAC value is updated sequentially in a feedback loop and asymptotically approaching a desired final value, the first few DAC transitions typically consume the largest current. This current can have components which are data dependent and data independent.

To reduce the required $C_{RESERVOIR}$ size, a combination high/low bandwidth reference buffer can be employed, whereby the high-bandwidth reference buffer is used for the first few decisions (e.g., transitions) and the low-bandwidth reference buffer is used for later decisions (e.g., transitions). This significantly decreases the size of the $C_{RESERVOIR}$ needed to achieve a certain accuracy of $VREF_{LBW}$ in the presence of data-dependent current while also enabling fast settling for the later decisions.

Figure 7:
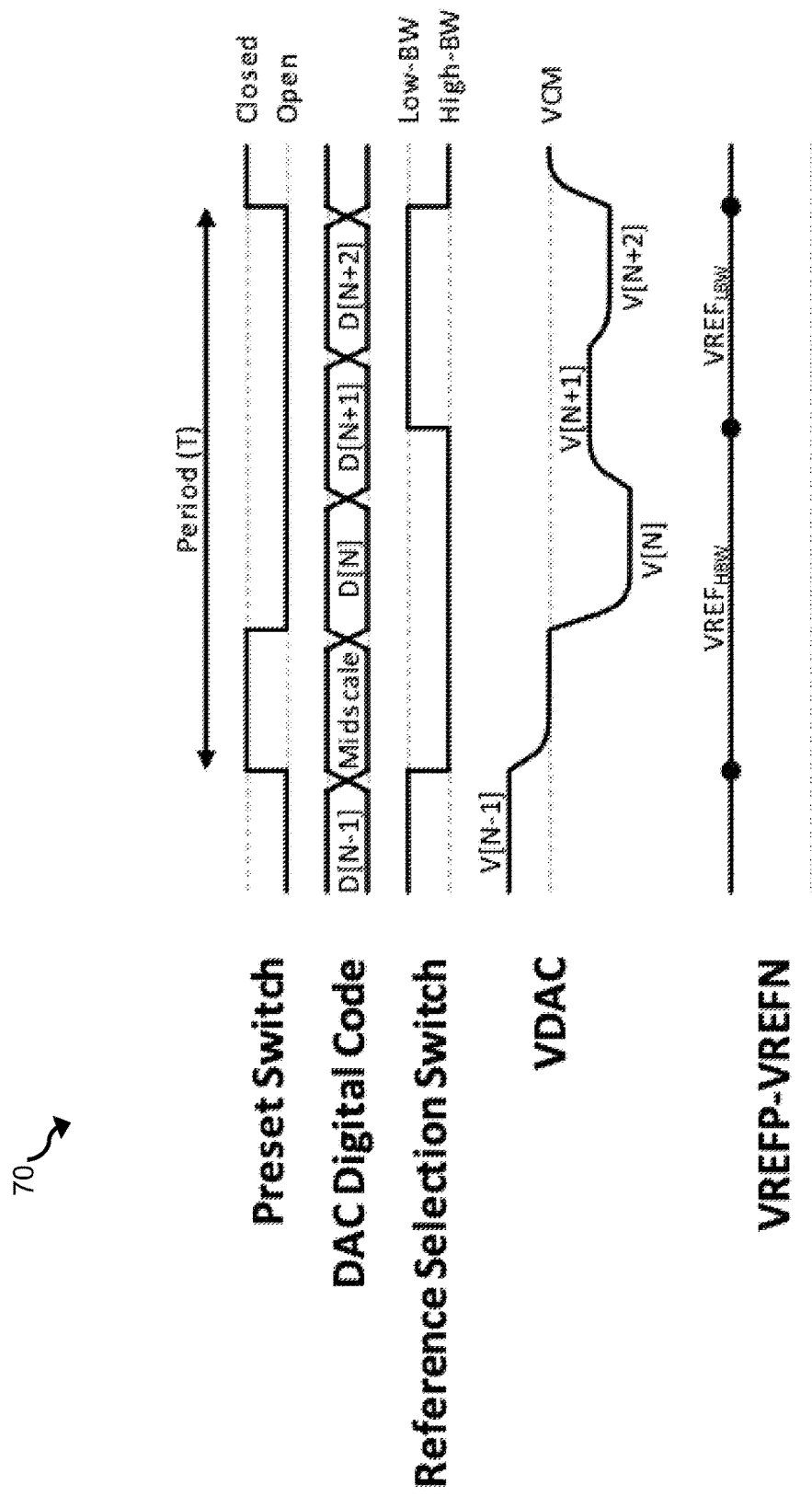
FIG. 7 is an example timing diagram for the DAC illustrated in FIG. 5 according to another embodiment where the DAC comprises a sequential DAC and/or a SAR DAC.

FIG. 7 is an example timing diagram 70 for DAC 50 according to another embodiment where DAC 50 comprises a sequential DAC and/or a SAR DAC. For each period T, the DAC 50 sequences through three digital codes. For all of the first digital code, the reference-voltage-selection switch 540 is in the HB state. The reference-voltage-selection switch 540 remains in the HB state for the first half or first portion of the second digital code. After the first half or first portion of the second digital code, the reference-voltage-selection switch 540 transitions to the LB state. The time in which the reference-voltage-selection switch 540 is in the HB state and/or the time at which the reference-voltage-selection switch 540 transitions from the HB state to the LB state can comprise a predetermined time period.

If $VREF_{HBW}=VREF_{LBW}$, VDAC does not change when the reference buffer is switched. The reference-voltage-selection switch 540 remains in the LB state for the third digital code. When the DAC transitions to the third digital code, the reservoir capacitor $C_{RESERVOIR}$ of the low-bandwidth buffers 590 supplies the current for DAC 50.

If there is a mismatch between $VREF_{HBW}$ and $VREF_{LBW}$ (e.g., $VREF_{HBW}$ is about equal to $VREF_{LBW}$ where "about" means plus or minus 10% of the relevant value), the voltage VDAC will change when switching between the two reference buffers. This will also result in some current to be sourced or sinked from the reservoir capacitance of $C_{RESERVOIR}$.

Figure 8:
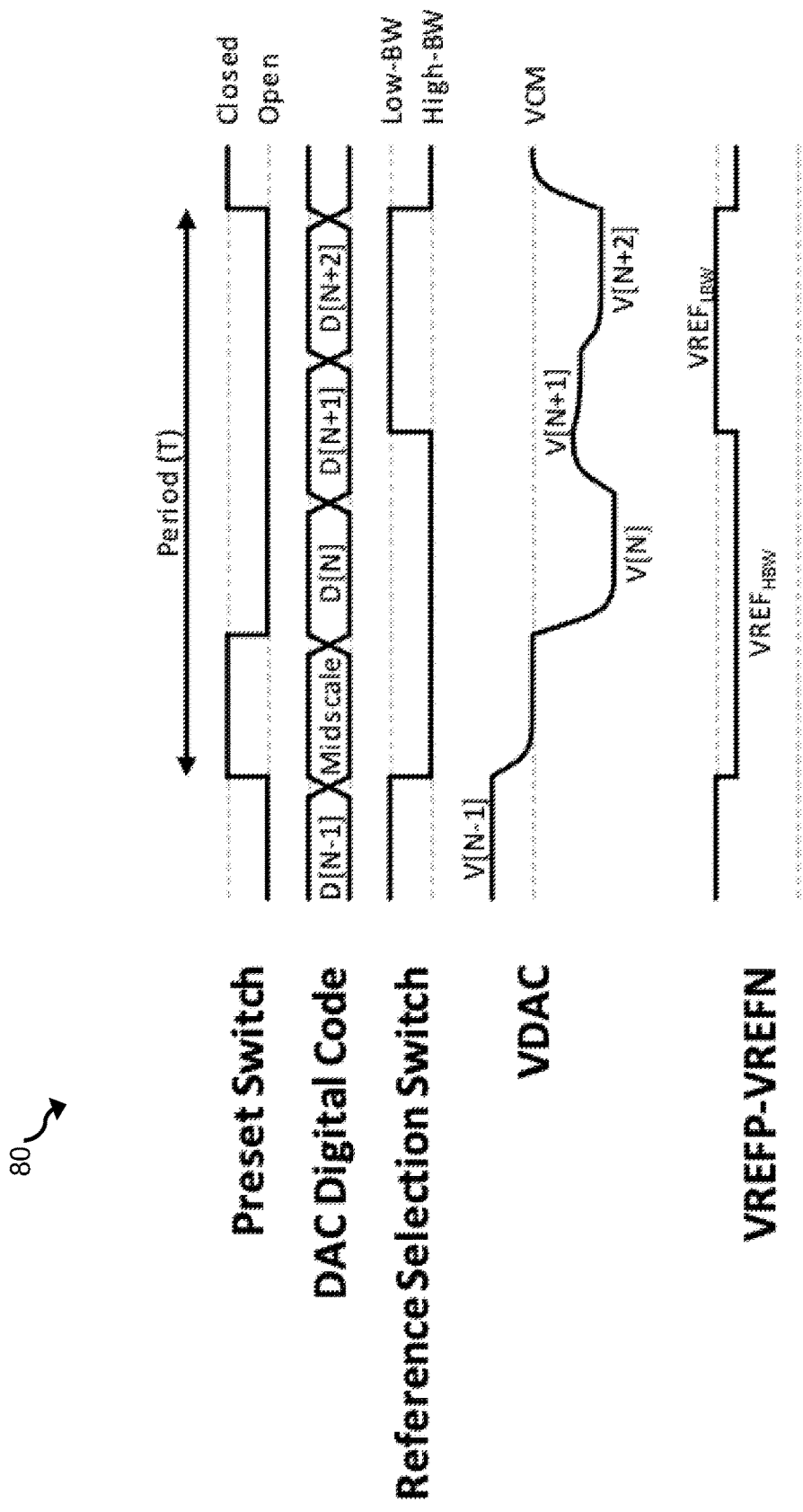
FIG. 8 is an example timing diagram for the DAC illustrated in FIG. 5 according to another embodiment where the DAC comprises a sequential DAC and/or a SAR DAC and with an example reference-voltage mismatch.

FIG. 8 is an example timing diagram 80 for DAC 50 according to another embodiment where DAC 50 comprises a sequential DAC and/or a SAR DAC and with an example reference-voltage mismatch.

As the DAC settling time is different with the high-bandwidth reference buffer compared to the low-bandwidth reference buffer, for maximal speed one can adjust the DAC clocking to optimize the settling time allocated for each mode (e.g., HBW and LBW). For example, the power can be optimized for HBW mode and the area can be optimized for LBW mode per design needs.

The combination high/low bandwidth reference buffer architecture, including the reference-voltage-selection switch, can be applied to both capacitive and resistive DACs.

The combination high/low bandwidth reference buffer architecture, including the reference-voltage-selection switch, can be extended to support multiple reference voltages that are used at various times for various segments of the DAC. For example, the entire DAC need not be connected to the same reference voltage. To minimize complexity, it may be desirable to connect the largest (e.g., most-significant bit (MSB)) segments of the DAC to a combination high/low bandwidth reference buffer but keep the smallest (e.g., least-significant bit (LSB)) segments of the DAC connected to a single reference buffer. The LSB segments can be connected to either the low-bandwidth reference buffers, to the high-bandwidth reference buffers, or to other reference-voltage buffers.

Figure 9:
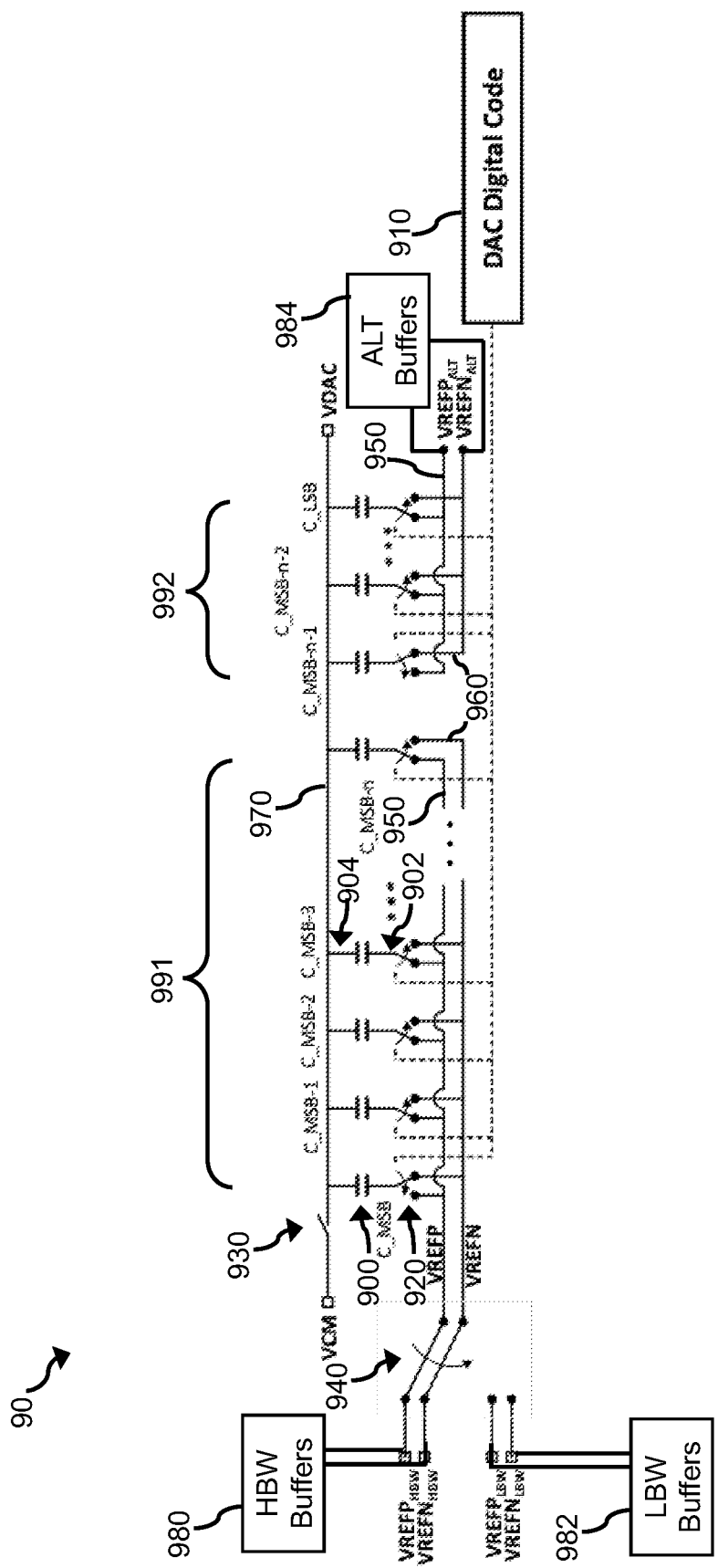
FIG. 9 is a schematic diagram of a DAC in which difference reference-voltage buffers are electrically coupled to different DAC segments according to an embodiment.

FIG. 9 is a schematic diagram of a DAC 90 in which different reference-voltage buffers are electrically coupled to different DAC segments according to an embodiment. The DAC 90 includes an array of capacitors 900, DAC digital code 910, capacitor switches 920, a preset switch 930, and a reference-voltage-selection switch 940. DAC 90 can be a switched-capacitor DAC, a successive-approximation (SAR) DAC, a time-interleaved DAC, or another DAC.

The capacitors 900, DAC digital code 910, capacitor switches 920, preset switch 930, and/or reference-voltage-selection switch 940 can be the same as or different than capacitors 500, DAC digital code 510, capacitor switches 520, preset switch 530, and/or reference-voltage-selection switch 540. For example, DAC 90 can be the same as DAC 50 except as described herein.

The capacitors 900 can be identical to one another, different from one another, or can include groups of different capacitors. The capacitors 900 comprise a first capacitor group 991 and a second capacitor group 992. In other embodiments, the capacitors 900 can comprise additional capacitor groups (e.g., M capacitor groups). The first capacitor group 991 can comprise or consist of the capacitors 900 that correspond to the MSBs or upper-bits of the DAC 90. For example, the first capacitor group 991 can comprise or consist of n capacitors 900 such as C_MSB, C_MSB–1, C_MSB–2, C_MSB–3, . . . C_MSB–n. In this example, C_MSB is the capacitor for the MSB, C_MSB–1 is the capacitor for the second-most-significant bit (i.e., MSB–1), C_MSB–2 is the capacitor for the third-most-significant bit (i.e., MSB–2), C_MSB–3 is the capacitor for the fourth-most-significant bit (i.e., MSB–3), and C_MSB–n is the capacitor for the (n+1)th-most-significant bit (i.e., MSB–n). The first capacitor group 991 can include additional or fewer capacitors 900 in other embodiments.

The second capacitor group 992 can comprise or consist of the capacitors 900 that correspond to the least-significant bits (LSBs) or lower-bits of the DAC 90. For example, the second capacitor group 992 can comprise or consist of M-n capacitors 900 where M is the total number of capacitors 900 and n is the number of capacitors 500 in the first capacitor group 991. The second capacitor group 992 can comprise or consist of C_MSB–n–1, C_MSB–n–2, and C_MSB–n–3 where C_MSB–n–1 is the capacitor for the nth-most-significant bit (i.e., MSB–n–1), C_MSB–n–2 is the capacitor for the (n–1)th-most-significant bit (i.e., MSB–n–2), and C_MSB–n–3 is the capacitor for the (n–2)th-most-significant bit (i.e., MSB–n–3), which can correspond to the 3 LSBs of DAC digital code 910. The second capacitor group 992 can include additional or fewer capacitors 900 in other embodiments.

A first terminal 902 of each capacitor 900 is electrically coupled to a respective capacitor switch 920. Each capacitor switch 920 has a first state in which the first terminal 902 is electrically coupled to a positive reference voltage line 950 and a second state in which the first terminal 902 is electrically coupled to a negative reference voltage line 960. The state of the capacitor switches 920 can be set using or based on the DAC digital code 910, which can be stored in memory (e.g., non-transitory memory). The positive and negative reference voltage lines 950, 960 for each capacitor group 991, 992 can be electrically coupled to different reference voltages, for example as described below.

A second terminal 904 of each capacitor 900 is electrically coupled to a DAC output line 970 that has an output terminal having an output VDAC voltage. The DAC output line 970 is also electrically coupled to a preset switch 930. The preset switch 930 has a closed state in which the DAC output line 970 is electrically coupled to a common-mode voltage VCM which sets the output VDAC voltage to be equal to the common-mode voltage VCM. In addition, the preset switch 930 has an opened state in which the DAC output line 970 is de-coupled from the common-mode voltage VCM.

The positive and negative reference voltage lines 950, 960 for the first capacitor group 991 are electrically coupled to the reference-voltage-selection switch 940. The reference-voltage-selection switch 940 has an HB state (e.g., a first state) and an LB state (e.g., a second state). When the reference-voltage-selection switch 940 is in the HB state, the positive and negative reference voltage lines 950, 960 in the first capacitor group 991 are electrically coupled to positive and negative high-bandwidth voltages $VREFP_{HBW}$ and $VREFN_{HBW}$, respectively. When the reference-voltage-selection switch 940 is in the LB state, the positive and negative reference voltage lines 950, 960 in the first capacitor group 991 are electrically coupled to positive and negative low-bandwidth voltages $VREFP_{LBW}$ and $VREFN_{HBW}$, respectively. The state of the reference-voltage-selection switch 940 can be set using or based on the DAC digital code 910. For example, a processor or processor-based controller can detect the DAC digital code 910 and set the reference-voltage-selection switch 940 based on the DAC digital code 910.

The positive and negative high-bandwidth voltages $VREFP_{HBW}$ and $VREFN_{HBW}$ can be produced by high-bandwidth reference buffers 980, which can be the same as high-bandwidth reference buffers 580. The positive and negative low-bandwidth voltages $VREFP_{LBW}$ and $VREFN_{HBW}$ can be produced by low-bandwidth reference buffers 982, which can be the same as low-bandwidth reference buffers 590.

Figure 10A:
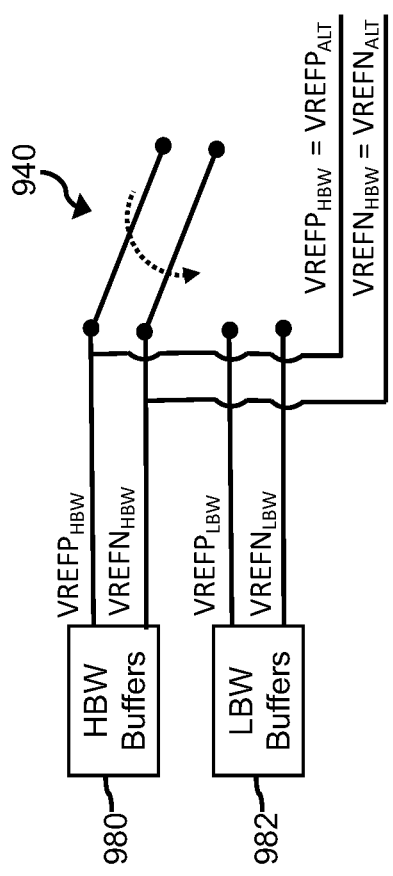
FIG. 10A illustrates an embodiment in which the alternative reference buffers in FIG. 9 are the same as the high-bandwidth reference buffers.
Figure 10B:
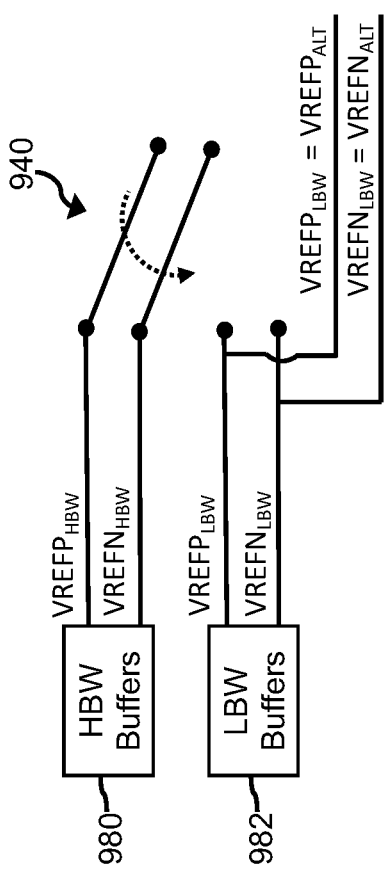
FIG. 10B illustrates an embodiment in which the alternative reference buffers in FIG. 9 are the same as the low-bandwidth reference buffers.

The positive and negative reference voltage lines 950, 960 for the second capacitor group 991 are electrically coupled to third positive and negative reference voltage sources $VREFP_{ALT}$, $VREFN_{ALT}$, respectively. The third positive and negative reference voltage sources can be produced by positive and negative alternative reference buffers 984. Alternative reference buffers 984 can be the same as high-bandwidth reference buffers 980, low-bandwidth reference buffers 982, or they can be another reference buffer. FIG. 10A illustrates an embodiment in which the alternative reference buffers 984 are the same as the high-bandwidth reference buffers 980 and thus the third positive and negative reference voltage sources $VREFP_{ALT}$, $VREFN_{ALT}$ are equal to the positive and negative high-bandwidth voltages $VREFP_{HBW}$ and $VREFN_{HBW}$, respectively. FIG. 10B illustrates an embodiment in which the alternative reference buffers 984 are the same as the low-bandwidth reference buffers 982 and thus the third positive and negative reference voltage sources $VREFP_{ALT}$, $VREFN_{ALT}$ are equal to the positive and negative high-bandwidth voltages $VREFP_{LBW}$ and $VREFN_{LBW}$, respectively.

In an embodiment, the capacitor sizes and reference values are arranged in such way that $VREF_{ALT} \times C\_MSB-n-1 = \frac{1}{2} VREF_{LBW} \times C\_MSB-n$. In this case, the bit weight of MSB-n-1 is exactly half of that of MSB-n, providing precise binary weight progression. In another embodiment, the capacitor sizes and reference values are arranged in such way that $VREF_{ALT} \times C\_MSB-n-1 > \frac{1}{2} VREF_{LBW} \times C\_MSB-n$. In this case, the lower bits provide overlapping range with the upper bits, providing an over-range capability. This may be important in cases where precise relation such as $VREF_{ALT} \times C\_MSB-n-1 = \frac{1}{2} VREF_{LBW} \times C\_MSB-n$ is difficult to achieve due to component mismatches. The over-range capacity provide a means of correcting such mismatch with digital calibration.

Figure 11:
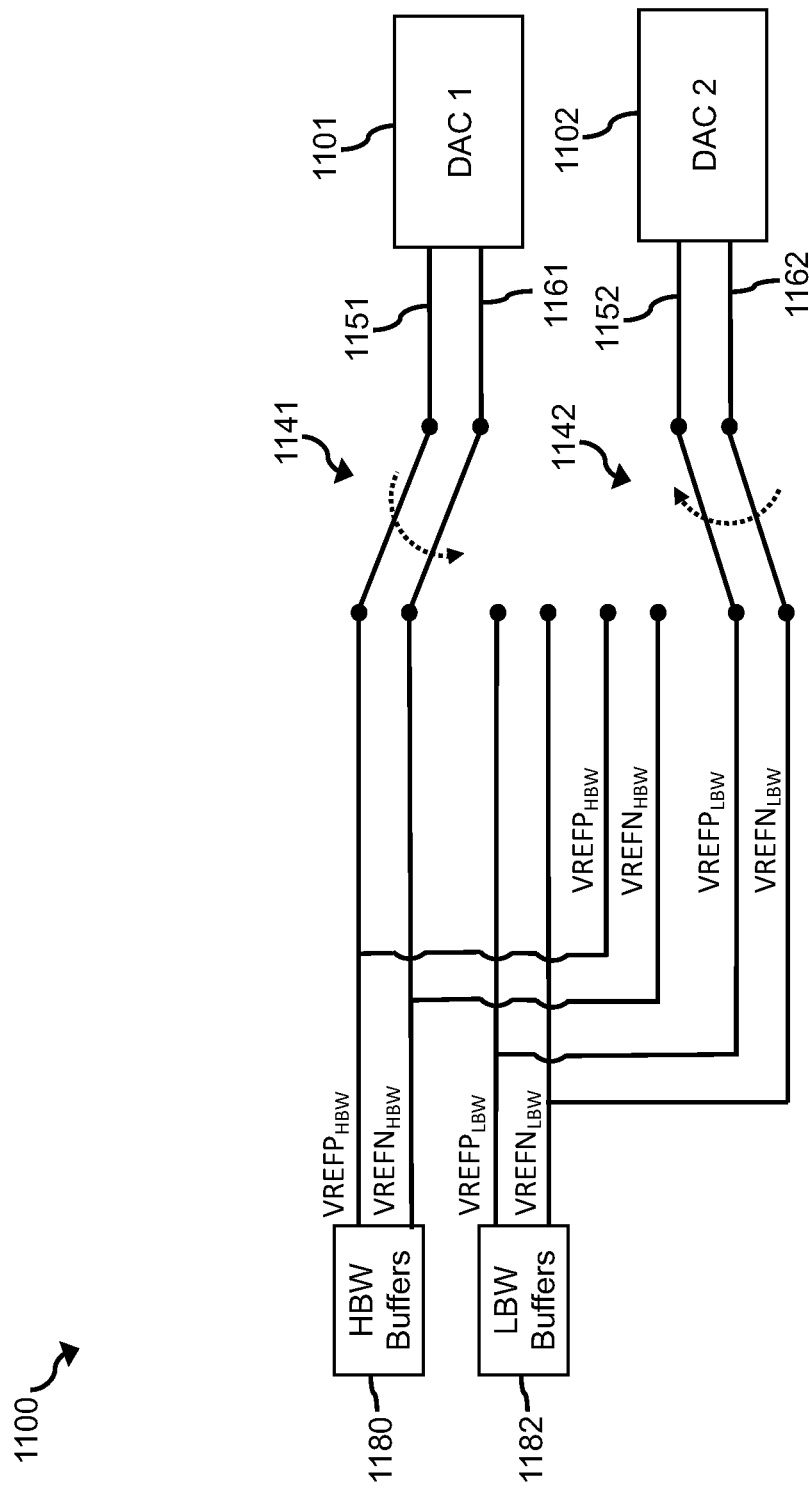
FIG. 11 is a schematic diagram of a device in which the reference buffers are shared between multiple DACs.

Many systems require multiple DACs to operate simultaneously, including time-interleaved systems. When multiple DACs are operating simultaneously, it is possible to optimize the reference-voltage-selection switch timing so that reference buffers can be shared between multiple DACs. FIG. 11 is a schematic diagram of a device 1100 in which the reference buffers are shared between multiple DACs. Device 1100 includes a first DAC 1101 electrically coupled to a first reference-voltage-selection switch 1141 and a second DAC 1102 electrically coupled to a second reference-voltage-selection switch 1142.

The first reference-voltage-selection switch 1141 has an HB state in which positive and negative reference voltage lines 1151, 1161 of the first DAC 1101 are electrically coupled to positive and negative high-bandwidth voltages $VREFP_{HBW}$ and $VREFN_{HBW}$, respectively. In addition, the first reference-voltage-selection switch 1141 has an LB state in which the positive and negative reference voltage lines 1151, 1161 of the first DAC 1101 are electrically coupled to positive and negative low-bandwidth voltages $VREFP_{LBW}$ and $VREFN_{HBW}$, respectively.

The second reference-voltage-selection switch 1142 has an HB state in which positive and negative reference voltage lines 1152, 1162 of the second DAC 1102 are electrically coupled to positive and negative high-bandwidth voltages $VREFP_{HBW}$ and $VREFN_{HBW}$, respectively. In addition, the second reference-voltage-selection switch 1142 has an LB state in which the positive and negative reference voltage lines 1152, 1162 of the second DAC 1102 are electrically coupled to positive and negative low-bandwidth voltages $VREFP_{LBW}$ and $VREFN_{HBW}$, respectively.

The positive and negative high-bandwidth voltages $VREFP_{HBW}$ and $VREFN_{HBW}$ can be produced by positive and negative high-bandwidth buffers 1180, which can be the same as high-bandwidth buffers 980. The positive and negative low-bandwidth voltages $VREFP_{LBW}$ and $VREFN_{HBW}$ can be produced by positive and negative low-bandwidth buffers 1182, which can be the same as low-bandwidth buffers 982.

Generally, it is desirable to share low-bandwidth reference buffers between multiple DACs if the $C_{RESERVOIR}$ and buffer drive strength increase proportionally to the number of DACs. In fact, if the data-dependent current is uncorrelated between multiple DACs, it can be advantageous to share low-bandwidth reference buffers between multiple DACs as this can reduce the required $C_{RESERVOIR}$ normalized for each DAC.

Figure 12:
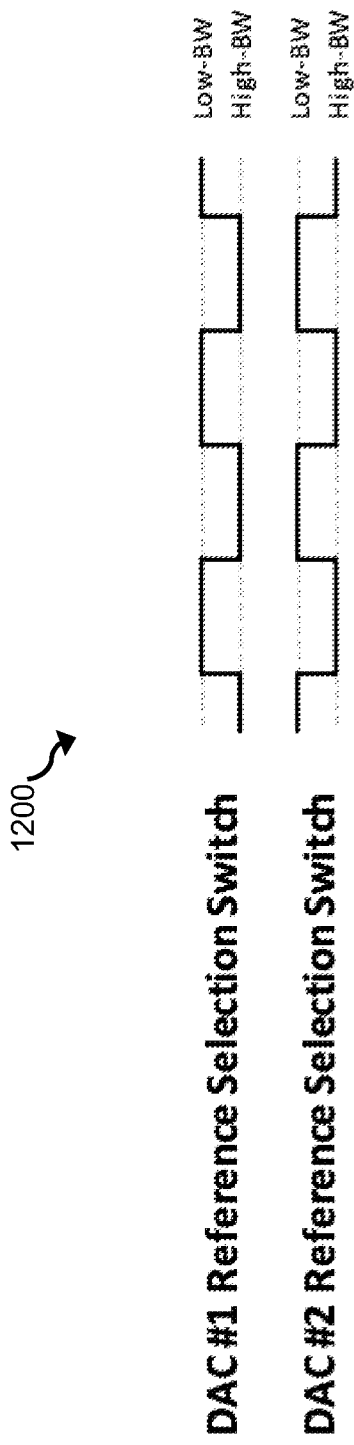
FIG. 12 is an example timing diagram of the reference buffers illustrated in FIG. 11.

It is not always desirable to share high-bandwidth reference buffers between multiple DACs as it can result in additional parasitic capacitance and resistance and can effectively increase the DAC settling time. However, as part of a combination high/low bandwidth reference buffer approach and through careful timing, high-bandwidth reference buffers can be shared between DACs. For example, if multiple DACs do not require a high-bandwidth reference buffer at the same time, they can be configured to share the same reference buffer. In this example, the first and second reference-voltage-selection switches 1141, 1142 would operate out of phase (e.g., completely out of phase), for example as illustrated in example timing diagram 1200 in FIG. 12. Timing controls can be used to set the phases and operation of the first and second reference-voltage-selection switches 1141, 1142 such as to optimize power (e.g., for HBW operation) and area (e.g., for LBW operation) per system requirements.

Example timing diagram 1200 illustrates that reference-voltage-selection switches 1141, 1142 for first and second DACs 1101, 1102, respectively, operate completely out of phase such that the reference buffers 1180, 1182 are never shared. When and while the positive and negative reference voltage lines 1151, 1161 of the first DAC 1101 are electrically coupled to the positive and negative high-bandwidth voltages $VREFN_{HBW}$ and $VREFN_{HBW}$, respectively, the positive and negative reference voltage lines 1152, 1162 of the second DAC 1102 are electrically coupled to the positive and negative low-bandwidth voltages $VREFP_{LBW}$ and $VREFN_{HBW}$. Conversely, when and while the positive and negative reference voltage lines 1152, 1162 of the second DAC 1102 are electrically coupled to the positive and negative low-bandwidth voltages $VREFP_{LBW}$ and $VREFN_{HBW}$, the positive and negative reference voltage lines 1151, 1161 of the first DAC 1101 are electrically coupled to the positive and negative high-bandwidth voltages $VREFN_{HBW}$ and $VREFN_{HBW}$. In addition, when and while the positive and negative reference voltage lines 1152, 1162 of the second DAC 1102 are electrically coupled to the positive and negative high-bandwidth voltages $VREFP_{HBW}$ and $VREFN_{HBW}$, the positive and negative reference voltage lines 1151, 1161 of the first DAC 1101 are electrically coupled to the positive and negative low-bandwidth voltages $VREFP_{LBW}$ and $VREFN_{HBW}$. Conversely, when and while the positive and negative reference voltage lines 1151, 1161 of the first DAC 1101 are electrically coupled to the positive and negative low-bandwidth voltages $VREFP_{LBW}$ and $VREFN_{HBW}$, the positive and negative reference voltage lines 1152, 1162 of the second DAC 1102 are electrically coupled to the positive and negative high-bandwidth voltages $VREFP_{HBW}$ and $VREFN_{HBW}$.

FIG. 13 is a flow chart of a method 1300 for operating a DAC according to an embodiment. Method 1300 can be performed with DAC 50, DAC 90, or device 1100.

In step 1301, positive and negative high-bandwidth reference voltages (e.g., VREFN$_{HBW}$ and VREFN$_{HBW}$) are produced using positive and negative high-bandwidth reference buffers, respectively. Each of the positive and negative high-bandwidth reference buffers have an output electrically coupled to a respective HB output resistor and a respective HB output time constant (e.g., output RC time constant) that is greater than or equal to a sampling period (T) of the DAC.

In step 1310, positive and negative low-bandwidth reference voltages (e.g., VREFP$_{LBW}$ and VREFN$_{LBW}$) are produced using positive and negative low-bandwidth reference buffers, respectively. Each of the positive and negative low-bandwidth reference buffers have an output electrically coupled to a respective LB output resistor and a respective LB output time constant (e.g., output RC time constant) that is less than the sampling period (T) of the DAC. The sampling period T is equal to $$\frac{1}{F_s}$$

where Fs is the sampling rate of the DAC.

In step 1320, a reference-voltage-selection switch in placed into an HB state to electrically couple a positive reference voltage line and a negative reference voltage line to the positive and negative high-bandwidth voltages, respectively. The positive and negative reference voltage lines are electrically coupled to an array of capacitors.

In step 1330, a digital-to-analog conversion of a DAC digital code is started, using the array of capacitors, while the reference-voltage-selection switch is in the HB state.

In step 1340, the reference-voltage-selection switch transitions to an LB state during the digital-to-analog conversion of the DAC digital code. In the LB state, the positive and negative reference voltage lines are electrically coupled to the positive and low-bandwidth voltages, respectively.

In some embodiments, the method 1300 can further comprise transitioning the reference-voltage-selection switch to the LB state after a predetermined time period from the start of the digital-to-analog conversion of the DAC digital code. In some embodiments, the method 1300 can further comprise starting the digital-to-analog conversion of a most-significant bit (MSB) of the DAC digital code when the reference-voltage-selection switch is in the HB state, transitioning the reference-voltage-selection switch to the LB state during the digital-to-analog conversion of the MSB, and performing the digital-to-analog conversion of a least-significant bit of the DAC digital code only when the reference-voltage-selection switch is in the LB state.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. A digital-to-analog converter (DAC) comprising:
an array of capacitors;
an array of capacitor switches, each capacitor switch electrically coupled to a first terminal of a respective capacitor and having a first state in which the first terminal is electrically coupled to a positive reference voltage line and a second state in which the first terminal is electrically coupled to a negative reference voltage line;
a positive high-bandwidth reference buffer having an input electrically coupled to a positive reference voltage and an output electrically coupled to a positive HB output resistor to produce a positive high-bandwidth reference voltage, the positive high-bandwidth reference buffer having a first HB output time constant that is greater than or equal to a sampling period (T) of the DAC;
a negative high-bandwidth reference buffer having an input electrically coupled to a negative reference voltage and an output electrically coupled to a negative HB output resistor to produce a negative high-bandwidth reference voltage, the negative high-bandwidth reference buffer having a second HB output time constant that is greater than or equal to T;
a positive low-bandwidth reference buffer having an input electrically coupled to the positive reference voltage and an output electrically coupled to a positive LB output resistor to produce a positive low-bandwidth reference voltage, the positive low-bandwidth reference buffer having a first LB output time constant that is less than T;
a negative low-bandwidth reference buffer having an input electrically coupled to the negative reference voltage and an output electrically coupled to a negative LB output resistor to produce a negative low-bandwidth reference voltage, the negative low-bandwidth reference buffer having a second LB output time constant that is less than T;
a reference-voltage-selection switch electrically coupled to the positive and negative reference voltage lines, the reference selecting switch having an HB state in which the positive and negative reference voltage lines are electrically coupled to the positive and negative high-bandwidth voltages, respectively, and an LB state in which the positive and negative reference voltage lines are electrically coupled to the positive and negative low-bandwidth voltages, respectively,
wherein:

$$T = \frac{1}{F_s}, \text{ and}$$

$F_s$ is a sampling rate of the DAC.

2. The DAC of claim 1, further comprising:
a positive LB output voltage line electrically coupled to the positive LB output resistor, the positive LB output voltage line having the positive low-bandwidth reference voltage;

a negative LB output voltage line electrically coupled to the negative LB output resistor, the negative LB output voltage line having the negative low-bandwidth reference voltage; and a reservoir capacitor having a first terminal electrically coupled to the positive LB output voltage line and a second terminal electrically coupled to the negative LB output voltage line.

3. The DAC of claim 1, further comprising a memory that stores DAC digital code, wherein:
the memory is electrically coupled to the capacitor switches and to the reference-voltage-selection switch,
the DAC digital code determines a state of each capacitor switch, and
the DAC digital code determines a state of the reference-voltage-selection switch.

4. The DAC of claim 3, wherein:
the DAC is configured to perform a digital-to-analog conversion of the DAC digital code during the sampling period, and
the reference-voltage-selection switch is in the HB state when the DAC starts the digital-to-analog conversion of the DAC digital code.

5. The DAC of claim 4, wherein the reference-voltage-selection switch transitions from the HB state to the LB state after a predetermined time period from the start of the digital-to-analog conversion of the DAC digital code.

6. The DAC of claim 4, wherein the reference-voltage-selection switch transitions from the HB state to the LB state during the digital-to-analog conversion of the DAC digital code.

7. The DAC of claim 4, wherein the reference-voltage-selection switch is only in the LB state during the digital-to-analog conversion of a least-significant bit in the DAC digital code.

8. The DAC of claim 5, wherein:
the DAC digital code is a first DAC digital code,
the reference-voltage-selection switch stays in the HB state for the digital-to-analog conversion of the first DAC digital code,
the reference-voltage-selection switch transitions from the HB state to the LB state during the digital-to-analog conversion of a second DAC digital code, the second DAC digital code stored in the memory, and
the digital-to-analog conversion of the second DAC digital code occurs after the digital-to-analog conversion of the first DAC digital code.

9. The DAC of claim 3, wherein:
the memory stores a plurality of DAC digital codes,
the DAC is configured to perform a digital-to-analog conversion of the plurality of DAC digital codes over a plurality of sampling periods, and
the reference-voltage-selection switch is in the HB state at a beginning of each sampling period.

10. The DAC of claim 1, wherein:
a root mean square of the positive high-bandwidth reference voltage is about equal to a root mean square of the positive low-bandwidth reference voltage, and
a root mean square of the negative high-bandwidth reference voltage is about equal to a root mean square of the negative low-bandwidth reference voltage.

11. A digital-to-analog converter (DAC) comprising:
an array of capacitors including first and second groups of the capacitors;
an array of capacitor switches, each capacitor switch electrically coupled to a first terminal of a respective capacitor and having a first state in which the first terminal is electrically coupled to a positive reference voltage line and a second state in which the first terminal is electrically coupled to a negative reference voltage line;

a positive high-bandwidth reference buffer having an input electrically coupled to a first positive reference voltage and an output electrically coupled to a positive HB output resistor to produce a positive high-bandwidth reference voltage, the positive high-bandwidth reference buffer having a first HB output time constant that is greater than or equal to a sampling period (T) of the digital-to-analog converter;

a negative high-bandwidth reference buffer having an input electrically coupled to a first negative reference voltage and an output electrically coupled to a negative HB output resistor to produce a negative high-bandwidth reference voltage, the negative high-bandwidth reference buffer having a second HB output time constant that is greater than or equal to T;

a positive low-bandwidth reference buffer having an input electrically coupled to the first positive reference voltage and an output electrically coupled to a positive LB output resistor to produce a positive low-bandwidth reference voltage, the positive low-bandwidth reference buffer having a first LB output time constant that is less than T;

a negative low-bandwidth reference buffer having an input electrically coupled to the first negative reference voltage and an output electrically coupled to a negative LB output resistor to produce a negative low-bandwidth reference voltage, the negative low-bandwidth reference buffer having a second LB output time constant that is less than T;

a reference-voltage-selection switch electrically coupled to the positive and negative reference voltage lines of the first group of capacitors, the reference-voltage-selection switch having an HB state in which the positive and negative reference voltage lines are electrically coupled to the positive and negative high-bandwidth voltages, respectively, and an LB state in which the positive and negative reference voltage lines are electrically coupled to the positive and negative low-bandwidth voltages, respectively, wherein:

$$T = \frac{1}{F_s},$$

$F_s$ is a sampling rate of the DAC, and
the positive and negative reference voltage lines of the second group of capacitors are electrically coupled to positive and negative third reference voltages, respectively.

12. The DAC of claim 11, wherein the positive and negative reference voltage lines of the second group of capacitors are electrically coupled to the positive and negative high-bandwidth reference voltages, respectively, whereby the positive and negative third reference voltages are the same as the positive and negative low-bandwidth reference voltages, respectively.

13. The DAC of claim 11, wherein the positive and negative reference voltage lines of the second group of capacitors are electrically coupled to the positive and negative high-bandwidth reference voltages, respectively, whereby the positive and negative third reference voltages are the same as the positive and negative high-bandwidth reference voltages, respectively.

14. The DAC of claim 11, further comprising:
a positive third reference buffer having an input electrically coupled to a second positive reference voltage and an output electrically coupled to a positive third output resistor to produce the positive third reference voltage; and
a negative third reference buffer having an input electrically coupled to a second negative reference voltage and an output electrically coupled to a negative third output resistor to produce the negative third reference voltage.

15. A system comprising:
a first digital-to-analog converter (DAC) comprising:
an array of first capacitors; and
an array of first capacitor switches, each first capacitor switch electrically coupled to a first terminal of a respective first capacitor and having a first state in which the first terminal is electrically coupled to a first positive reference voltage line and a second state in which the first terminal is electrically coupled to a first negative reference voltage line;
a second DAC comprising:
an array of second capacitors; and
an array of second capacitor switches, each second capacitor switch electrically coupled to a first terminal of a respective second capacitor and having a first state in which the first terminal of the respective second capacitor is electrically coupled to a second positive reference voltage line and a second state in which the first terminal of the respective second capacitor is electrically coupled to a second negative reference voltage line;
a positive high-bandwidth reference buffer having an input electrically coupled to a positive reference voltage and an output electrically coupled to a positive HB output resistor to produce a positive high-bandwidth reference voltage, the positive high-bandwidth reference buffer having a first HB output time constant that is greater than or equal to a sampling period (T) of the digital-to-analog converter;
a negative high-bandwidth reference buffer having an input electrically coupled to a negative reference voltage and an output electrically coupled to a negative HB output resistor to produce a negative high-bandwidth reference voltage, the negative high-bandwidth reference buffer having a second HB output time constant that is greater than or equal to T;
a positive low-bandwidth reference buffer having an input electrically coupled to the positive reference voltage and an output electrically coupled to a positive LB output resistor to produce a positive low-bandwidth reference voltage, the positive low-bandwidth reference buffer having a first LB output time constant that is less than T;
a negative low-bandwidth reference buffer having an input electrically coupled to the negative reference voltage and an output electrically coupled to a negative LB output resistor to produce a negative low-bandwidth reference voltage, the negative low-bandwidth reference buffer having a second LB output time constant that is less than T;
a first DAC reference-voltage-selection switch electrically coupled to the first positive and first negative reference voltage lines, the first DAC reference-voltage-selection switch having a first HB state in which the first positive and first negative reference voltage lines are electrically coupled to the positive and negative high-bandwidth voltages, respectively, and a first LB state in which the first positive and first negative reference voltage lines are electrically coupled to the positive and negative low-bandwidth voltages, respectively; and
a second DAC reference-voltage-selection switch electrically coupled to the second positive and second negative reference voltage lines, the second DAC reference-voltage-selection switch having a second HB state in which the second positive and second negative reference voltage lines are electrically coupled to the positive and negative high-bandwidth voltages, respectively, and a second LB state in which the second positive and second negative reference voltage lines are electrically coupled to the positive and negative low-bandwidth voltages, respectively;
wherein:

$$T = \frac{1}{F_s}, \text{ and}$$

$F_s$ is a sampling rate of the DAC.

16. The system of claim 15, wherein the first and second DAC reference-voltage-selection switches are configured to switch out of phase such that:
when the first DAC reference-voltage-selection switch is in the first HB state, the second DAC reference-voltage-selection switch is in the second LB state, and
when the first DAC reference-voltage-selection switch is in the first LB state, the second DAC reference-voltage-selection switch is in the second HB state.

17. The system of claim 16, wherein:
when the second DAC reference-voltage-selection switch is in the second HB state, the first DAC reference-voltage-selection switch is in the first LB state, and
when the second DAC reference-voltage-selection switch is in the second LB state, the first DAC reference-voltage-selection switch is in the first HB state.

18. The system of claim 15, wherein the first and second DACs comprise a time-interleaved DAC.

19. A method of operating a digital-to-analog converter (DAC), comprising:
producing positive and negative high-bandwidth reference voltages with positive and negative high-bandwidth reference buffers, respectively, each of the positive and negative high-bandwidth reference buffers having an output electrically coupled to a respective HB output resistor and having a respective HB output time constant that is greater than or equal to a sampling period (T) of the DAC;
producing positive and negative low-bandwidth reference voltages with positive and negative low-bandwidth reference buffers, respectively, each of the positive and negative low-bandwidth reference buffers having an output electrically coupled to a respective LB output resistor and having a respective LB output time constant that is less than T;
placing a reference-voltage-selection switch in an HB state to electrically couple a positive reference voltage line and a negative reference voltage line to the positive and negative high-bandwidth voltages, respectively, wherein the positive and negative reference voltage lines are electrically coupled to an array of capacitors;

with the array of capacitors, starting a digital-to-analog conversion of a DAC digital code while the reference-voltage-selection switch is in the HB state; and transitioning the reference-voltage-selection switch to an LB state during the digital-to-analog conversion of the DAC digital code, wherein in the LB state the positive and negative reference voltage lines are electrically coupled to the positive and low-bandwidth voltages, respectively, wherein:

$$T = \frac{1}{F_s}, \text{ and}$$

$F_s$ is a sampling rate of the DAC.

20. The method of claim 19, further comprising transitioning the reference-voltage-selection switch to the LB state after a predetermined time period from a start of the digital-to-analog conversion of the DAC digital code.

21. The method of claim 20, further comprising:
starting the digital-to-analog conversion of a most-significant bit (MSB) of the DAC digital code when the reference-voltage-selection switch is in the HB state;
transitioning the reference-voltage-selection switch to the LB state during the digital-to-analog conversion of the MSB; and
performing the digital-to-analog conversion of a least-significant bit of the DAC digital code only when the reference-voltage-selection switch is in the HB state.

* * * * *